United States Patent
Chen et al.

(10) Patent No.: US 9,601,403 B2
(45) Date of Patent: Mar. 21, 2017

(54) ELECTRONIC PACKAGE AND FABRICATION METHOD THEREOF

(71) Applicant: Siliconware Precision Industries Co., Ltd., Taichung (TW)

(72) Inventors: Lu-Yi Chen, Taichung (TW); Guang-Hwa Ma, Taichung (TW); Shih-Ching Chen, Taichung (TW); Chang-Lun Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/982,276

(22) Filed: Dec. 29, 2015

(65) Prior Publication Data

US 2017/0047262 A1 Feb. 16, 2017

(30) Foreign Application Priority Data

Aug. 14, 2015 (TW) .............................. 104126500 A (51) Int. Cl.
| | |
|---|---|
| H01L 27/32 | (2006.01) |
| H01L 23/31 | (2006.01) |
| H01L 25/16 | (2006.01) |
| H01L 25/065 | (2006.01) |
| H01L 23/498 | (2006.01) |
| H01L 21/48 | (2006.01) |
| H01L 21/56 | (2006.01) |
| H01L 25/00 | (2006.01) |

(52) U.S. Cl.
CPC ...... *H01L 23/3128* (2013.01); *H01L 21/4853* (2013.01); *H01L 21/56* (2013.01); *H01L 23/49838* (2013.01); *H01L 25/0652* (2013.01); *H01L 25/16* (2013.01); *H01L 25/50* (2013.01)

(58) Field of Classification Search
None
See application file for complete search history.

(56) References Cited

U.S. PATENT DOCUMENTS

| | | | | |
|---|---|---|---|---|
| 5,899,705 A | * | 5/1999 | Akram | ............... H01L 23/13 257/E21.509 |
| 6,169,329 B1 | * | 1/2001 | Farnworth | ........ H01L 23/49833 257/693 |
| 7,960,825 B2 | * | 6/2011 | Lin | ............... H01L 23/49811 257/692 |

(Continued)

*Primary Examiner* — Michael Lebentritt
(74) *Attorney, Agent, or Firm* — Mintz Levin Cohn Ferris Glovsky and Popeo, P.C.; Peter F. Corless; Steven M. Jensen (57) ABSTRACT

An electronic package is provided, which includes: a first circuit structure; at least first electronic element disposed on a surface of the first circuit structure; at least a first conductive element formed on the surface of the first circuit structure; a first encapsulant encapsulating the first electronic element and the first conductive element; and a second circuit structure formed on the first encapsulant and electrically connected to the first conductive element. By directly disposing the electronic element having high I/O functionality on the circuit structure, the invention eliminates the need of a packaging substrate having a core layer and thus reduces the thickness of the electronic package. The invention further provides a method for fabricating the electronic package.

19 Claims, 6 Drawing Sheets

(56) References Cited

U.S. PATENT DOCUMENTS

| | | | |
|---|---|---|---|
| 8,372,741 B1* | 2/2013 | Co | H01L 24/03 219/56.22 |
| 2001/0006828 A1* | 7/2001 | McMahon | H01L 23/49833 438/109 |
| 2002/0113323 A1* | 8/2002 | Nakanishi | H01L 23/3114 257/784 |
| 2003/0193545 A1* | 10/2003 | Boucher | B41J 2/14072 347/50 |
| 2004/0119162 A1* | 6/2004 | Egawa | H01L 24/97 257/734 |
| 2008/0272464 A1* | 11/2008 | Do | H01L 21/6835 257/620 |
| 2009/0242259 A1* | 10/2009 | Ho | H05K 1/0218 174/261 |
| 2009/0250811 A1* | 10/2009 | Pendse | H01L 21/563 257/737 |
| 2009/0325344 A1* | 12/2009 | Takiar | H01L 24/05 438/109 |
| 2010/0244212 A1* | 9/2010 | Ha | H01L 21/568 257/676 |
| 2011/0011626 A1* | 1/2011 | Yamauchi | H05K 1/056 174/250 |
| 2013/0020710 A1* | 1/2013 | Chew | H01L 21/4846 257/762 |
| 2013/0126223 A1* | 5/2013 | Yamauchi | G11B 5/486 174/262 |
| 2014/0048959 A1* | 2/2014 | Hu | H01L 24/24 257/782 |
| 2014/0054802 A1* | 2/2014 | Shim | H01L 21/561 257/787 |
| 2014/0251658 A1* | 9/2014 | Lin | H05K 1/0271 174/252 |
| 2015/0027752 A1* | 1/2015 | Takakura | H05K 1/118 174/251 |
| 2016/0155731 A1* | 6/2016 | Tung | H01L 23/3114 438/107 |
| 2016/0163566 A1* | 6/2016 | Chen | H01L 23/3128 257/774 |
| 2016/0240466 A1* | 8/2016 | Chen | H01L 23/3114 |

* cited by examiner

ELECTRONIC PACKAGE AND FABRICATION METHOD THEREOF

CROSS-REFERENCES TO RELATED APPLICATIONS

This application claims under 35 U.S.C. §119(a) the benefit of Taiwanese Application No. 104126500, filed Aug. 14, 2015, the entire contents of which are incorporated herein by reference.

BACKGROUND OF THE INVENTION

1. Field of the Invention

The present invention relates to electronic packages, and more particularly, to an electronic package having a reduced size and a fabrication method thereof.

2. Description of Related Art

Along with the rapid development of electronic industries, electronic products are developed toward the trend of multi-function and high performance. Accordingly, there have been developed various types of flip-chip packaging modules such as chip scale packages (CSPs), direct chip attached (DCA) packages and multi-chip modules (MCM), and 3D IC chip stacking technologies.

Figure 1:
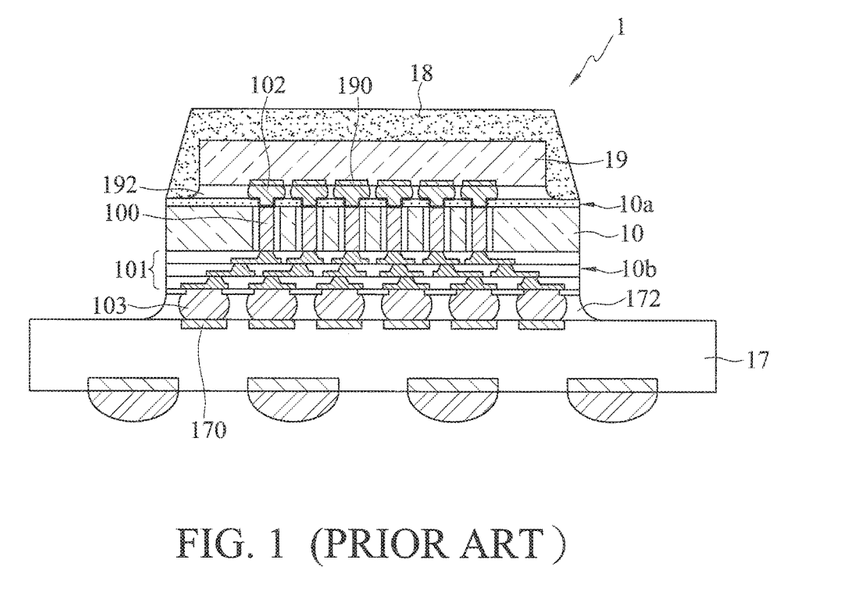
FIG. 1 is a schematic cross-sectional view of a conventional semiconductor package.

FIG. 1 is a schematic cross-sectional view of a conventional 3D chip stacking-type semiconductor package 1. Referring to FIG. 1, a silicon interposer 10 is provided. The silicon interposer 10 has a chip mounting side 10a, an external connection side 10b opposite to the chip mounting side 10a and having a plurality of redistribution layers 101 formed thereon, and a plurality of through silicon vias (TSVs) 100 communicating the chip mounting side 10a and the external connection side 10b. A semiconductor chip 19 having a plurality of electrode pads 190 is disposed on the chip mounting side 10a of the silicon interposer 10 and the electrode pads 190 are electrically connected to the chip mounting side 10a of the silicon interposer 10 through a plurality of solder bumps 102. The electrode pads 190 have a small pitch therebetween. Further, an underfill 192 is formed between the semiconductor chip 19 and the chip mounting side 10a of the silicon interposer 10 for encapsulating the solder bumps 102. Furthermore, an encapsulant 18 is formed on the silicon interposer 10 to encapsulate the semiconductor chip 19. In addition, a packaging substrate 17 having a plurality of bonding pads 170 is disposed on the external connection side 10b of the silicon interposer 10 and the bonding pads 170 are electrically connected to the redistribution layers 101 through a plurality of conductive elements 103 such as bumps. The bonding pads 170 of the packaging substrate 17 have a large pitch therebetween. Also, an underfill 172 is formed to encapsulate the conductive elements 103.

To fabricate the semiconductor package 1, the semiconductor chip 19 is disposed on the silicon interposer 10 first and then the silicon interposer 10 having the semiconductor chip 19 is disposed on the packaging substrate 17 through the conductive elements 103. Subsequently, the encapsulant 18 is formed, thereby obtaining the semiconductor packager 1.

In the conventional semiconductor package 1, the silicon interposer 10 serves as a signal transmission medium between the semiconductor chip 19 and the packaging substrate 17. To achieve a suitable silicon interposer 10, the TSVs 100 must be controlled to have a certain depth to width ratio (100 um/10 um), thus consuming a large amount of time and chemical agent and incurring a high fabrication cost.

Further, the packaging substrate 17 has a core layer containing glass fiber. Consequently, the packaging substrate 17 is quite thick, which hinders miniaturization of the semiconductor package 1.

Furthermore, when the semiconductor chip 19 has features of fine trace width, fine pitch and high I/O count, the area of the silicon interposer 10 and the area of the corresponding packaging substrate 17 must be increased, thereby hindering miniaturization of the semiconductor package 1.

Therefore, how to overcome the above-described drawbacks has become critical.

SUMMARY OF THE INVENTION

In view of the above-described drawbacks, the present invention provides an electronic package, which comprises: a first circuit structure having a first surface and a second surface opposite to the first surface; at least a first electronic element disposed on the first surface of the first circuit structure; a first encapsulant formed on the first surface of the first circuit structure to encapsulate the first electronic element; at least a first conductive element formed on the first surface of the first circuit structure and embedded in and exposed from the first encapsulant; and a second circuit structure formed on the first encapsulant and electrically connected to the first conductive element.

In the above-described package, the first encapsulant can encapsulate the first conductive element.

The above-described package can further comprise at least a second electronic element disposed on the first encapsulant and electrically connected to the second circuit structure. Further, a second encapsulant can be formed on the first encapsulant for encapsulating the second electronic element.

In the above-described package, an opening can be formed in the first encapsulant to expose a portion of the first surface of the first circuit structure, and a third electronic element can be disposed on the exposed portion of the first circuit structure. The third electronic element can be electrically connected to the second circuit structure or the second electronic element.

In the above-described package, an opening can be formed in the first encapsulant to expose a portion of the first surface of the first circuit structure, and the first conductive element can be received in the opening and connected to the second circuit structure. Further, a second encapsulant can be formed on the first encapsulant and in the opening for encapsulating the second electronic element and the first conductive element. Furthermore, the second encapsulant can have at least an opening, and the second electronic element can be partially exposed from the opening for bonding with a fourth electronic element.

The present invention further provides a method for fabricating an electronic package, which comprises the steps of: providing a first circuit structure having opposite first and second surfaces; forming at least a first conductive element on the first surface of the first circuit structure and disposing at least a first electronic element on the first surface of the first circuit structure; forming a first encapsulant on the first surface of the first circuit structure to encapsulate the first electronic element and the first conductive element, wherein the first conductive element is exposed from the first encapsulant; forming a second circuit structure on the first encapsulant, wherein the second circuit structure is electrically connected to the first conductive element; and disposing at least a second electronic element on the first encapsulant, wherein the second electronic element is electrically connected to the second circuit structure.

The above-described method can further comprise forming a second encapsulant on the first encapsulant to encapsulate the second electronic element.

The present invention further provides another method for fabricating an electronic package, which comprises the steps of: providing a first circuit structure having opposite first and second surfaces; disposing at least a first electronic element on the first surface of the first circuit structure; forming a first encapsulant on the first surface of the first circuit structure to encapsulate the first electronic element, wherein the first encapsulant has at least an opening exposing a portion of the first surface of the first circuit structure; forming a second circuit structure on the first encapsulant; disposing at least a second electronic element on the first encapsulant, wherein the second electronic element is electrically connected to the second circuit structure; and forming a plurality of first conductive elements on the second circuit structure and the portion of the first circuit structure exposed from the opening of the first encapsulant.

In the above-described method, the number of the opening in the first encapsulant can be more than one, at least a third electronic element being received in one of the openings and the first conductive elements being received in the other openings. The third electronic element can be electrically connected to the second electronic element or the second circuit structure.

The above-described method can further comprise forming a second encapsulant on the first encapsulant and in the opening to encapsulate the second electronic element and the first conductive elements. The second encapsulant can have at least an opening, and the second electronic element can be partially exposed from the opening for bonding with a fourth electronic element.

The above-described two methods can further comprise forming a plurality of second conductive elements on the second surface of the first circuit structure.

Therefore, by directly disposing the first electronic element having high I/O functionality on the first circuit structure, the present invention eliminates the need of a packaging substrate having a core layer so as to reduce the thickness of the electronic package.

Further, the first conductive element is exposed from the first encapsulant and the second electronic element on the first encapsulant can be electrically connected to the first conductive element so as to be further electrically connected to the first electronic element. As such, the present invention reduces the area of the electronic package.

BRIEF DESCRIPTION OF DRAWINGS

FIG. 3C' is a schematic cross-sectional view showing a method for fabricating an electronic package according to a third embodiment of the present invention, wherein FIG. 3C'' shows another embodiment of FIG. 3C'.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2G are schematic cross-sectional views showing a method for fabricating an electronic package 2 according to a first embodiment of the present invention.

Figure 2A:
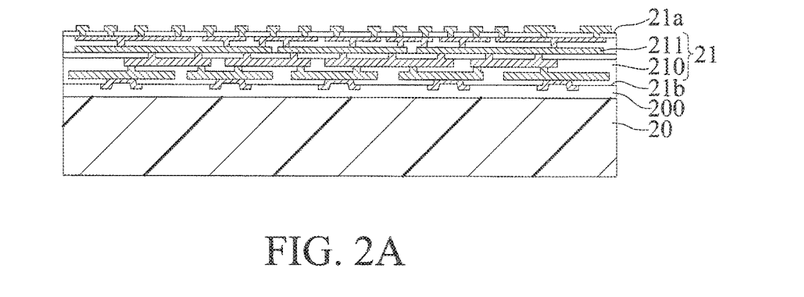
FIGS. 2A to 2G are schematic cross-sectional views showing a method for fabricating an electronic package according to a first embodiment of the present invention.

Referring to FIG. 2A, a carrier 20 having a first circuit structure 21 is provided.

The carrier 20 can be a semiconductor substrate made of, for example, a silicon wafer or glass. A bonding layer 200 is formed on the carrier 20 to bond with the first circuit structure 21. The bonding layer 200 is, for example, a thermal $SiO_2$ layer, a release layer or a protection layer. In the present embodiment, the carrier 20 is a silicon wafer and the bonding layer 200 is a thermal $SiO_2$ layer.

The first circuit structure 21 has a first surface 21a and a second surface 21b opposite to the first surface 21a and bonded to the bonding layer 200. The first circuit structure 21 has at least a dielectric layer 210 and a redistribution layer 211 formed on the dielectric layer 210.

Figure 2B:
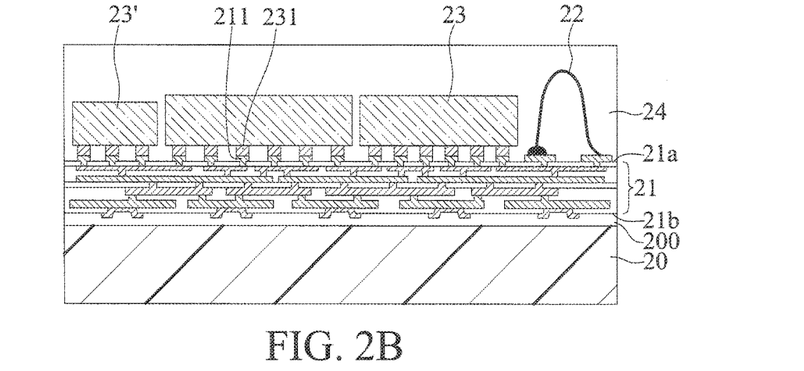

Referring to FIG. 2B, a plurality of first electronic elements 23, 23' are disposed on the first surface 21a of the first circuit structure 21, and at least a first conductive element 22 is formed on the first surface 21a of the first circuit structure 21. Then, a first encapsulant 24 is formed on the first surface 21a of the first circuit structure 21 to encapsulate the first electronic elements 23, 23' and the first conductive element 22.

In the present embodiment, each of the first electronic elements 23, 23' is an active element such as a semiconductor chip, a passive element such as a resistor, a capacitor or an inductor, or a combination thereof.

The first electronic elements 23, 23' are electrically connected to the first circuit structure 21 in a flip-chip manner. In particular, the first electronic elements 23 are electrically connected to the redistribution layer 211 of the first circuit structure 21 through a plurality of solder bumps 231, and an underfill (not shown) is optionally formed to secure the first electronic elements 23 to the first surface 21a of the first circuit structure 21. Alternatively, the first electronic elements 23, 23' can be electrically connected to the redistribution layer 211 of the first circuit structure 21 through wire bonding.

The first conductive element 22 is a bonding wire formed through a wire bonding process and has a wire loop. Alternatively, the first conductive element 22 can be a conductive post (not shown).

The first encapsulant 24 is made of polyimide, a dry film, an epoxy resin or a molding compound.

Figure 2C:
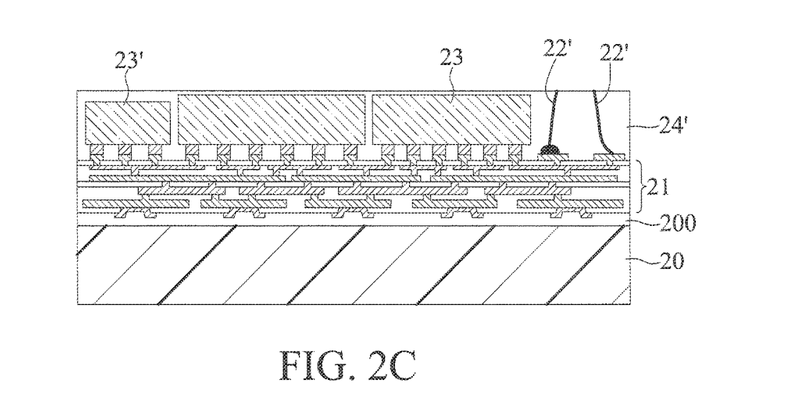

Referring to FIG. 2C, a planarization process is performed. That is, the first encapsulant 24 is partially removed to form a planarized first encapsulant 24'. Also, the first conductive element 22 is partially removed to form two separated segments 22'. Each of the segments 22' has an end exposed from the surface of the first encapsulant 24'.

In the present embodiment, the first encapsulant 24 is partially removed by grinding. Further, the first electronic elements 23, 23' are not exposed from the surface of the first encapsulant 24' after the grinding process.

Figure 2D:
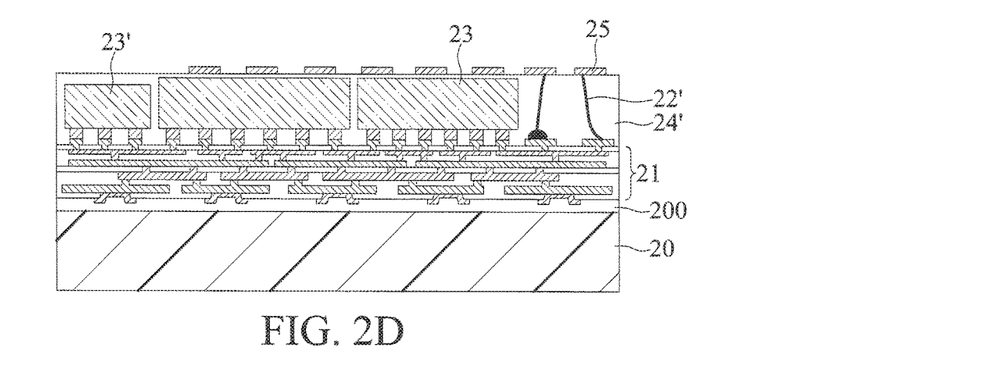

Referring to FIG. 2D, a second circuit structure 25 is formed on the first encapsulant 24' and in contact with the first conductive elements 22'. Then, an electrical test is performed on the first electronic elements 23, 23', the first conductive elements 22', the first circuit structure 21 and the second circuit structure 25.

In the present embodiment, the second circuit structure 25 is a redistribution layer.

Further, a circuit test can be performed after disposing of the first electronic elements 23, 23' (chips and passive elements). After the first and second circuit structures 21, 25 are determined to function properly, KGDs (Known good dies) i.e., a plurality of second electronic elements 26, can be disposed, which will be described later. Therefore, the yield of the final package is improved.

Figure 2E:
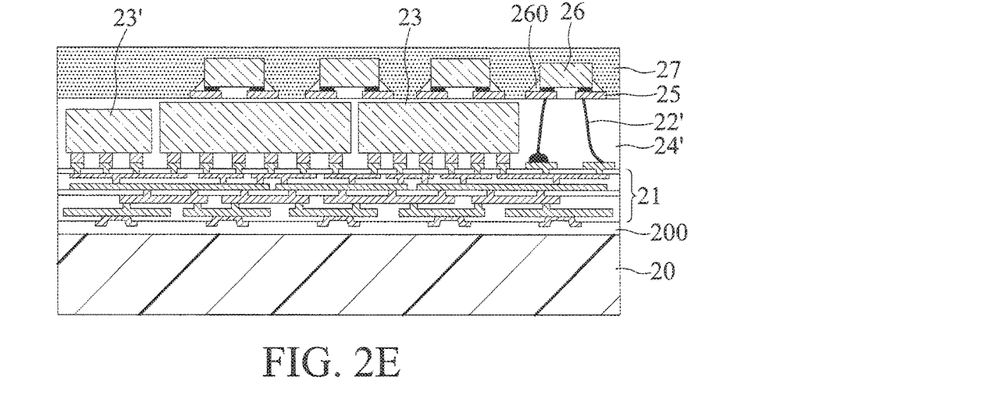

Referring to FIG. 2E, a plurality of second electronic elements 26 are disposed on the second circuit structure 25 and then a second encapsulant 27 is formed on the first encapsulant 24' to encapsulate the second electronic elements 26.

In the present embodiment, each of the second electronic elements 26 is an active element such as a semiconductor chip, a passive element such as a resistor, a capacitor or an inductor, or a combination thereof. For example, the second electronic elements 26 are electrically connected to the second circuit structure 25 in a flip-chip manner and an underfill 260 is optionally formed to secure the second electronic elements 26 to the second circuit structure 25. Alternatively, the second electronic elements 26 can be electrically connected to the second circuit structure 25 through wire bonding.

The second encapsulant 27 is made of a material that is the same as or different from the first encapsulant 24'. The second encapsulant 27 is made of polyimide, a dry film, an epoxy resin or a molding compound.

Figure 2F:
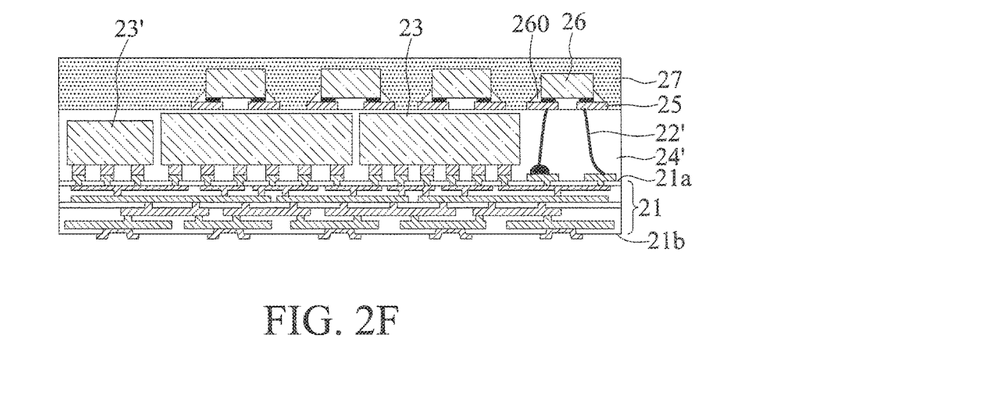

Referring to FIG. 2F, the carrier 20 and the bonding layer 200 are removed to expose the second surface 21b of the first circuit structure 21.

Figure 2G:
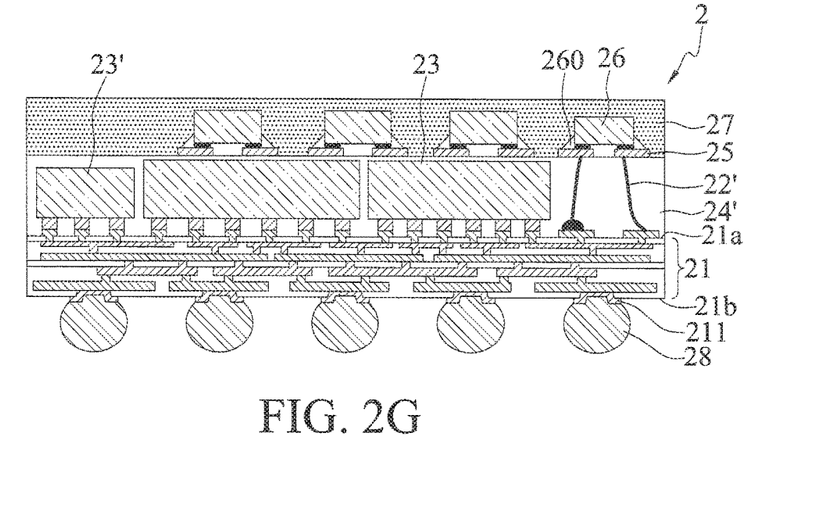

Referring to FIG. 2G, a plurality of second conductive elements 28 are formed on the second surface 21b of the first circuit structure 21.

In the present embodiment, the second conductive elements 28 are solder balls, metal bumps or metal pins. The second conductive elements 28 are bonded and electrically connected to the redistribution layer 211 of the first circuit structure 21.

Figure 3A:
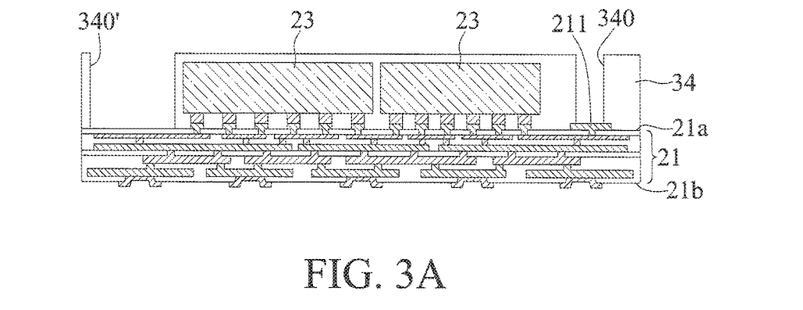
FIGS. 3A to 3C are schematic cross-sectional views showing a method for fabricating an electronic package according to a second embodiment of the present invention.
Figure 3B:
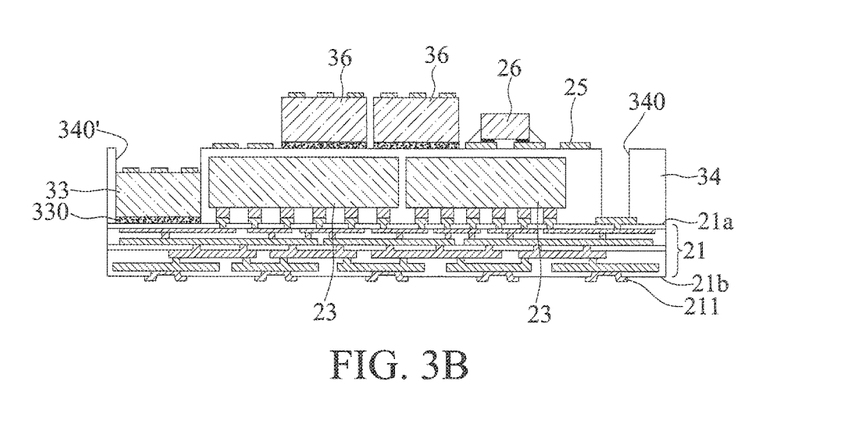
Figure 3C:
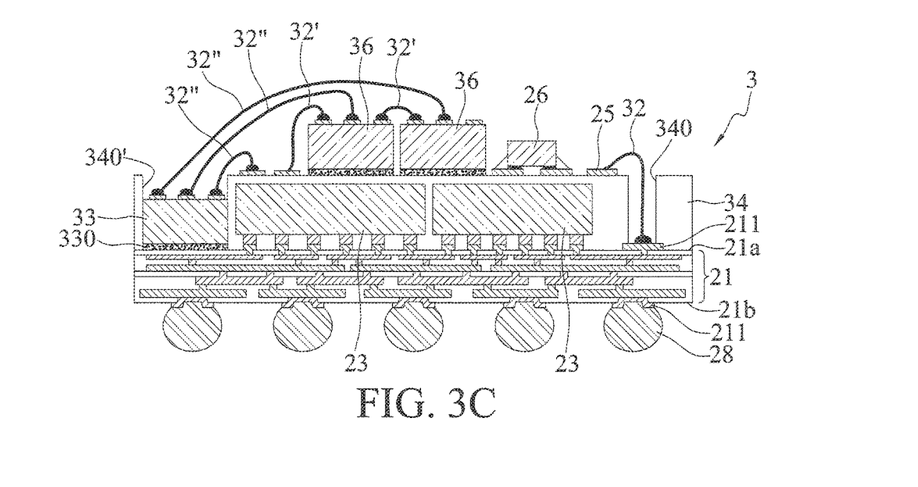

FIGS. 3A to 3C are schematic cross-sectional views showing a method for fabricating an electronic package 3 according to a second embodiment of the present invention. The second embodiment differs from the first embodiment in the process of the first conductive elements 32, 32', 32".

Referring to FIG. 3A, continued from the process of FIG. 2A (description of the carrier 20 and the bonding layer 200 is omitted), a plurality of first electronic elements 23 are disposed on the first surface 21a of the first circuit structure 21. Then, a first encapsulant 34 is formed on the first surface 21a of the first circuit structure 21 to encapsulate the first electronic elements 23. Subsequently, a plurality of openings 340, 340' are formed in the first encapsulant 34 to expose portions of the first surface 21a of the first circuit structure 21 (or portions of the redistribution layer 211).

In the present embodiment, the first encapsulant 34 is made of polyimide, a dry film, an epoxy resin or a molding compound.

Referring to FIG. 3B, a second circuit structure 25 is formed on the first encapsulant 34 and a plurality of second electronic elements 26, 36 are disposed on the second circuit structure 25.

In the present embodiment, the second electronic elements 36 are disposed on the first encapsulant 34 through an adhesive material 360.

During disposing of the second electronic elements 26, 36, at least a third electronic element 33 is disposed on the first surface 21a of the first circuit structure 21 in the opening 340' through an adhesive material 330. The third electronic element 33 is an active element such as a semiconductor chip, a passive element such as a resistor, a capacitor or an inductor, or a combination thereof.

In an alternative embodiment, the second circuit structure 25 is formed on the first encapsulant 34 before formation of the openings 340, 340' in the first encapsulant 34.

Referring to FIG. 3C, a plurality of first conductive elements 32, 32', 32" are formed on the second circuit structure 25, the redistribution layer 211 in the opening 340, the second electronic elements 26, 36 and the third electronic element 33. Further, a plurality of second conductive elements 28 are formed on the second surface 21b of the first circuit structure 21.

In the present embodiment, the first conductive elements 32, 32', 32" are bonding wires formed through wire bonding and have wire loops.

The second circuit structure 25 is electrically connected to the redistribution layer 211 of the first circuit structure 21 through the first conductive element 32. The second electronic elements 26 are electrically connected to the second circuit structure 25 in a flip-chip manner and the second electronic elements 36 are electronic connected to one another or the second circuit structure 25 through bonding wires, i.e., the first conductive elements 32'.

The third electronic element 33 is electrically connected to the second circuit structure 25 and some of the second electronic elements 36 through bonding wires, i.e., the first conductive elements 32".

FIG. 3C' is a schematic cross-sectional view showing a method for fabricating an electronic package 3' according to a third embodiment of the present invention. The third embodiment differs from the second embodiment in the addition of a second encapsulant.

Referring to FIG. 3C', a second encapsulant 37 is formed on the first encapsulant 34 and in the openings 340, 340' to encapsulate the second electronic elements 26, 36, the third electronic element 33 and the first conductive elements 32, 32', 32".

In the present embodiment, the second encapsulant 37 is made of a material that is the same as or different from the first encapsulant 34. The second encapsulant 37 is made of polyimide, a dry film, an epoxy resin or a molding compound.

In another embodiment, referring to FIG. 3C", at least an opening 370 is formed in the second encapsulant 37 to expose a portion of the second electronic element 36, thereby allowing a fourth electronic element 39 to be bonded to the second electronic element 36. The fourth electronic element 39 can be a sensor chip.

According to the present invention, a plurality of electronic elements (the first electronic elements 23, 23' and the third electronic element 33) having high I/O functionality are directly disposed on the first circuit structure 21. Therefore, the present invention eliminates the need of a packaging substrate having a core layer so as to reduce the thickness of the electronic package 2, 3, 3', 3".

Further, by directly disposing the electronic elements (the first electronic elements 23, 23' and the third electronic element 33) on the first circuit structures 21, the present invention reduces the trace pitch between these electronic elements.

Furthermore, since the electronic elements arranged in stack manner are electrically connected through bonding wires, i.e., the first conductive elements 22', 32, 32', 32", the present invention reduces the size and cost of the electronic package 2, 3, 3', 3".

The present invention further provides an electronic package 2, 3, 3', 3", which has: a first circuit structure 21 having a first surface 21a and a second surface 21b opposite to the first surface 21a; at least a first electronic element 23, 23' disposed on the first surface 21a of the first circuit structure 21; a first encapsulant 24', 34 formed on the first surface 21a of the first circuit structure 21 to encapsulate the first electronic element 23, 23'; at least a first conductive element 22', 32 formed on the first surface 21a of the first circuit structure 21 and embedded in and exposed from the first encapsulant 24', 34; and a second circuit structure 25 formed on the first encapsulant 24', 34 and electrically connected to the first conductive element 22', 32.

The electronic package 2, 3, 3', 3" can further have at least a second electronic element 26, 36 disposed on the first encapsulant 24', 34 and electrically connected to the second circuit structure 25.

In an embodiment, the first encapsulant 24' encapsulates the first conductive element 22'.

In an embodiment, the electronic package 2 further has a second encapsulant 27 formed on the first encapsulant 24' to encapsulate the second electronic element 26.

In an embodiment, an opening 340' is formed in the first encapsulant 34 to expose a portion of the first surface 21a of the first circuit structure 21, and a third electronic element 33 is disposed on the exposed portion of the first circuit structure 21 and electrically connected to the second circuit structure 25 or the second electronic element 36.

In an embodiment, an opening 340 is formed in the first encapsulant 34 to expose a portion of the first surface 21a of the first circuit structure 21, and the first conductive element 32 is received in the opening 340 and connected to the second circuit structure 25. Further, the electronic package 3', 3" can have a second encapsulant 37 formed on the first encapsulant 34 and in the opening 340 for encapsulating the second electronic element 26, 36 and the first conductive element 32. Furthermore, at least an opening 370 can be formed in the second encapsulant 37 to partially expose the second electronic element 36, thereby allowing a fourth electronic element 39 to be bonded to the second electronic element 36.

In an embodiment, the electronic package 2, 3, 3', 3" further has a plurality of second conductive elements 28 formed on the second surface 21b of the first circuit structure 21.

Therefore, by directly disposing electronic elements having high I/O functionality on the first circuit structure, the present invention eliminates the need of a packaging substrate having a core layer so as to reduce the thickness of the electronic package.

Further, the first conductive element is exposed from the first encapsulant and the second electronic element on the first encapsulant can be electrically connected to the first conductive element so as to be further electrically connected to the first electronic element. As such, the present invention reduces the area of the electronic package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. An electronic package, comprising:
   a first circuit structure having a first surface and a second surface opposite to the first surface;
   at least a first electronic element disposed on the first surface of the first circuit structure;
   a first encapsulant formed on the first surface of the first circuit structure to encapsulate the first electronic element;
   at least a first conductive element formed on the first surface of the first circuit structure and embedded in and exposed from the first encapsulant; and
   a second circuit structure formed on the first encapsulant and electrically connected to the first conductive element.

2. The package of claim 1, wherein the first encapsulant encapsulates the first conductive element.

3. The package of claim 1, wherein an opening is formed in the first encapsulant to expose a portion of the first surface of the first circuit structure, and a third electronic element is disposed on the exposed portion of the first circuit structure.

4. The package of claim 3, wherein the third electronic element is electrically connected to the second circuit structure.

5. The package of claim 1, wherein an opening is formed in the first encapsulant to expose a portion of the first surface of the first circuit structure, the first conductive element being received in the opening and connected to the second circuit structure.

6. The package of claim 5, further comprising a second encapsulant formed in the opening to encapsulate the first conductive element.

7. The package of claim 1, further comprising at least a second electronic element disposed on the first encapsulant and electrically connected to the second circuit structure.

8. The package of claim 7, further comprising a second encapsulant formed on the first encapsulant for encapsulating the second electronic element.

9. The package of claim 7, further comprising a fourth electronic element bonded to the second electronic element.

10. The package of claim 1, further comprising a plurality of second conductive elements formed on the second surface of the first circuit structure.

11. A method for fabricating an electronic package, comprising the steps of:
    providing a first circuit structure having opposite first and second surfaces;
    forming at least a first conductive element on the first surface of the first circuit structure and disposing at least a first electronic element on the first surface of the first circuit structure;
    forming a first encapsulant on the first surface of the first circuit structure to encapsulate the first electronic element and the first conductive element, wherein the first conductive element is exposed from the first encapsulant;

forming a second circuit structure on the first encapsulant, wherein the second circuit structure is electrically connected to the first conductive element; and disposing at least a second electronic element on the first encapsulant, wherein the second electronic element is electrically connected to the second circuit structure.

12. The method of claim 11, further comprising forming a second encapsulant on the first encapsulant to encapsulate the second electronic element.

13. The method of claim 11, further comprising forming a plurality of second conductive elements on the second surface of the first circuit structure.

14. A method for fabricating an electronic package, comprising the steps of:

providing a first circuit structure having opposite first and second surfaces;

disposing at least a first electronic element on the first surface of the first circuit structure;

forming a first encapsulant on the first surface of the first circuit structure to encapsulate the first electronic element, wherein the first encapsulant has at least an opening exposing a portion of the first surface of the first circuit structure;

forming a second circuit structure on the first encapsulant;

disposing at least a second electronic element on the first encapsulant, wherein the second electronic element is electrically connected to the second circuit structure; and forming a plurality of first conductive elements on the second circuit structure and the portion of the first circuit structure exposed from the opening of the first encapsulant.

15. The method of claim 14, wherein the number of the opening in the first encapsulant is more than one, at least a third electronic element being received in one of the openings and the first conductive elements being received in the other openings.

16. The method of claim 15, wherein the third electronic element is electrically connected to the second electronic element or the second circuit structure.

17. The method of claim 14, further comprising forming a second encapsulant on the first encapsulant and in the opening to encapsulate the second electronic element and the first conductive elements.

18. The method of claim 17, wherein the second encapsulant has at least an opening, the second electronic element being partially exposed from the opening for bonding with a fourth electronic element.

19. The method of claim 14, further comprising forming a plurality of second conductive elements on the second surface of the first circuit structure.

* * * * *